United States Patent [19]

Fournier et al.

[11] Patent Number: 4,926,057
[45] Date of Patent: May 15, 1990

[54] ANALOG RECORDING AND INTEGRATION OF ELECTRIC SIGNALS

[76] Inventors: Danièle Fournier, 18, rue de la Procession, 75015 Paris; François Charbonnier, 11, rue Salvadore Allende, 92240 Malakoff; Alberr-Claude Boccara, 14, rue des Meuniers, 75012 Paris, all of France

[21] Appl. No.: 309,767
[22] PCT Filed: May 16, 1988
[86] PCT No.: PCT/FR88/00251
§ 371 Date: Jan. 13, 1989
§ 102(e) Date: Jan. 13, 1989
[87] PCT Pub. No.: WO88/08986
PCT Pub. Date: Nov. 17, 1988

[30] Foreign Application Priority Data

May 14, 1987 [FR] France ................... 8706773

[51] Int. Cl.$^5$ ............................................. H01J 40/14
[52] U.S. Cl. ................... 250/578.1; 358/244
[58] Field of Search ............... 250/578, 211 J; 358/244

[56] References Cited

U.S. PATENT DOCUMENTS 2,324,851 7/1943 Koch .
4,305,098 12/1981 Mitchell ........................ 358/244
4,673,269 6/1987 Schiff et al. .................... 358/244

FOREIGN PATENT DOCUMENTS 8300933 3/1983 PCT Int'l Appl. .

OTHER PUBLICATIONS

Electronics, vol. 49, No. 12, 6/1976, New York, Shaphard: "Advances in CRT Design Augur Improved Oscilloscopes", pp. 113–119.
Hewlett-Packard Journal, vol. 33, No. 4, 4/1982, Oldfield et al.: "Wideband, Fast-Writing Oscilloscope Solves Difficult Measurement Problems", pp. 26–31.

Primary Examiner—David C. Nelms
Assistant Examiner—Khaled Shami
Attorney, Agent, or Firm—William A. Drucker

[57] ABSTRACT

The device comprises a high speed oscilloscope on the screen of which is formed by scanning a light path representative of the amplitude variation as a function of the time of the signal to be processed. Each point of such path is transformed by an astigmatic optical system into a light segment of constant length projected with off-set on a strip of photodiodes so that each sensor element of the strip receives a light band of a heigth proportional to the ordinate of the corresponding point of the path. An electronic circuit reads the strip after a predetermined number of passages of the signal. The result is displayed on an oscilloscope and stored in a memory after analog-digital conversion.

9 Claims, 7 Drawing Sheets

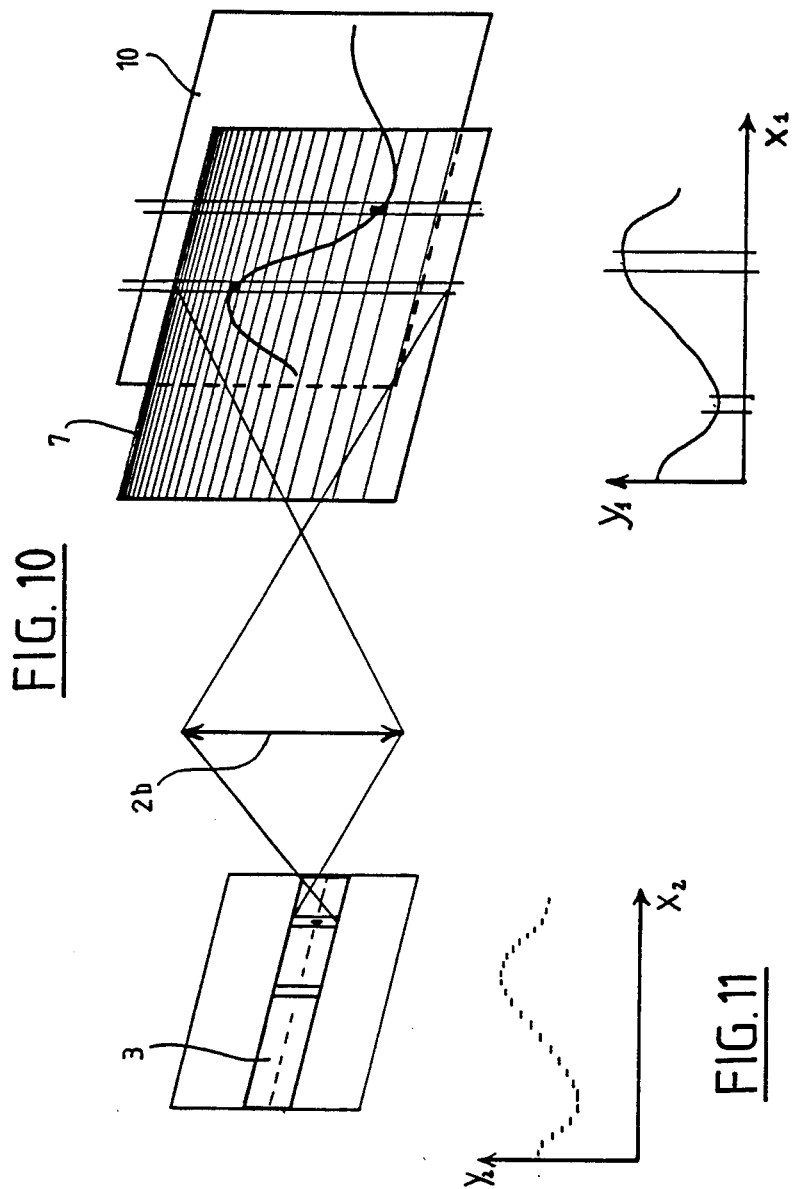

ANALOG RECORDING AND INTEGRATION OF ELECTRIC SIGNALS

The invention relates to a method and device for acquiring and integrating repetitive electric signals.

For some years, there has been considerable development in high speed analog or digital oscilloscopes. The signals are stored by transferring to a digital memory in the first case and by means of a photographic system or a video camera in the second.

When a repetitive signal is analysed and when it is affected by random noise, without correlation with the signal, it is advantageous and even necessary to provide the sum or the mean thereof. In fact it is known that the gain of the signal to noise ratio which results from N accumulations of the noise affected signal is equal to $\sqrt{N}$ (voltage ratio gain).

This mean is very often provided digitally, either directly by means of processors included in the oscilloscope or by coupling with an external computer, or in a hybrid fashion using a video tape recorder coupled to a system for digitizing the video signal in delayed time.

Each of the above mentioned systems has the main drawback of introducing dead times or limiting the rate of acquiring successive signals:

for digital signals, the transfer time to the storage memory is typically of the order of a microsecond per measuring point, for video tape recorder acquisition, it is not possible to exceed a rate of a few tens of Hertz.

The document Electronics, vol 49, no. 12, June 1976, pages 113-119 describes either the association with a cathode ray tube or a linear photodiode strip (CCD), or a matrix of such strips, placed upstream of the screen of the tube and receiving the electron beam therefrom, modulated in intensity by the signal.

In the first solution, the electron beam undergoes no vertical deflection, whereas in the second it effects X and Y scanning.

In both cases, the individual detector elements of the strip operate by all or nothing and each strip only delivers a single information (abscissa or ordinate) concerning the signal. The device is not able to follow high speed intensity variations.

It is the same in the CCD strip device described in the document EP-A-0 187 087.

To sum up, none of the above solutions allows repetitive signals with very rapid variation to be recorded in order to find the mean thereof.

The present invention aims at providing a method and device for recording and integrating repetitive signals answering better than those known heretofore the present requirements of signal processing, particularly in that they introduce no limit to the repetition rate of the signals to be acquired and they make it possible to obtain, for a given measurement time, a signal to noise ratio far better than those of systems available on the instrumentation market.

The method of the invention is of the trace analysis type, i.e. it comprises the generation of an electronic beam providing X and Y scanning representative of the amplitude variation of the signal as a function of time (which is not the case in the above document "Electronics").

It is characterized by recording the path of the beam on a strip of detectors each element of which, having the form of a narrow strip of given abscissa and of constant length, receives a flux proportional to the ordinate of the point of the path which corresponds to said abscissa.

Thus, the horizontal coordinate (usually the time) is associated with the position of a detector of the strip, whereas the vertical coordinate (amplitude of the signal to be measured) is proportional to the charge of this detector.

For integrating the signal, the method comprises the accumulation of the charges generated in the strip during a pre-determined number of passages less than that which would saturate the detector elements and reading the strip to collect information of the mean ordinates.

In a preferred embodiment of the device of the invention, each point of the path is transformed by an astigmatic optical system into a light segment of constant length projected with off-set on the corresponding element of the strip so that it covers a light band of height proportional to the ordinate of said point.

The invention will be better understood from reading the following description.

In the accompanying drawings,

FIG. 4 illustrates, by way of example, the follow up of a trace described by the spot of the oscilloscope by means of the device of FIG. 1, whereas FIG. 5 illustrates the electric charge Q of each of the diodes;

FIGS. 10-12 illustrate schematically a third embodiment which uses an optical attenuator with variable attenuation.

Figure 1:
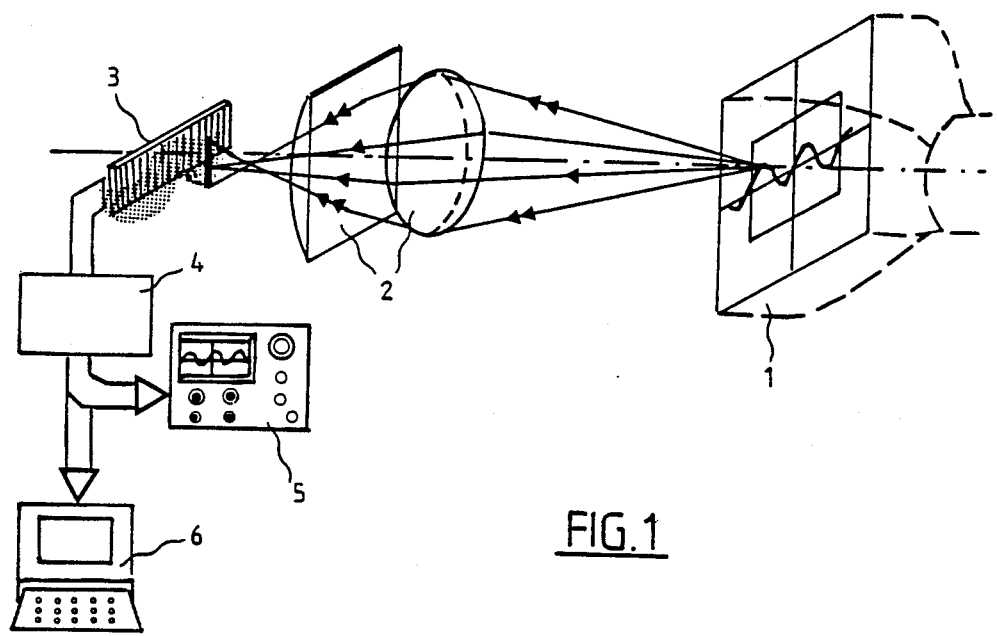
FIG. 1 is a general diagram of a device comprising a photodiode strip according to a preferred embodiment of the invention.

The device shown in FIG. 1 comprises an oscilloscope 1, preferably a high speed one, on the vertical deflection elements of which the electric signal to be analysed is applied. The variation of this signal as a function of time is thus materialized by the trace of the spot on the fluorescent screen of the oscilloscope. An astigmatic conjugation optical system 2, by way of example, formed of a photographic type objective and a cylindrical lens, makes it possible to associate with the light spot, representing a point of the trace, a vertical light segment of uniform luminance in the plane of the photodiode strip 3. During horizontal scanning of the screen by the spot, this light segment will be successively opposite the different diodes of the strip. This first correspondence provides location of the horizontl position of the spot.

Figure 2:
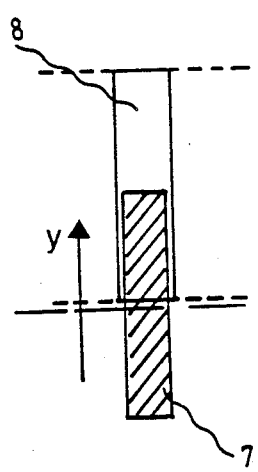
FIG. 2 shows the covering of one of the photodiodes of the strip by a vertical light segment.
Figure 3:
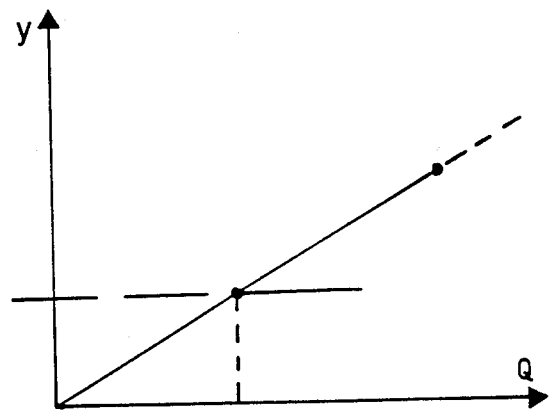
FIG. 3 shows how the illumination (product of lighting by the time) so the electric response Q of a diode varies as a function of the vertical position Y of the spot.

As shown in FIGS. 2 and 3, the off-set of the image with respect to the strip is such that covering by the light segment 7 of constant length of one of the diodes 8 of strip 3, which diode is associated with a given horizontal position of the spot, varies linearly as a function of the vertical movement of spot Y. The measurement of the electric charge of this diode will therefore form a measurement of the vertical position of the spot.

Figures 4, 5:
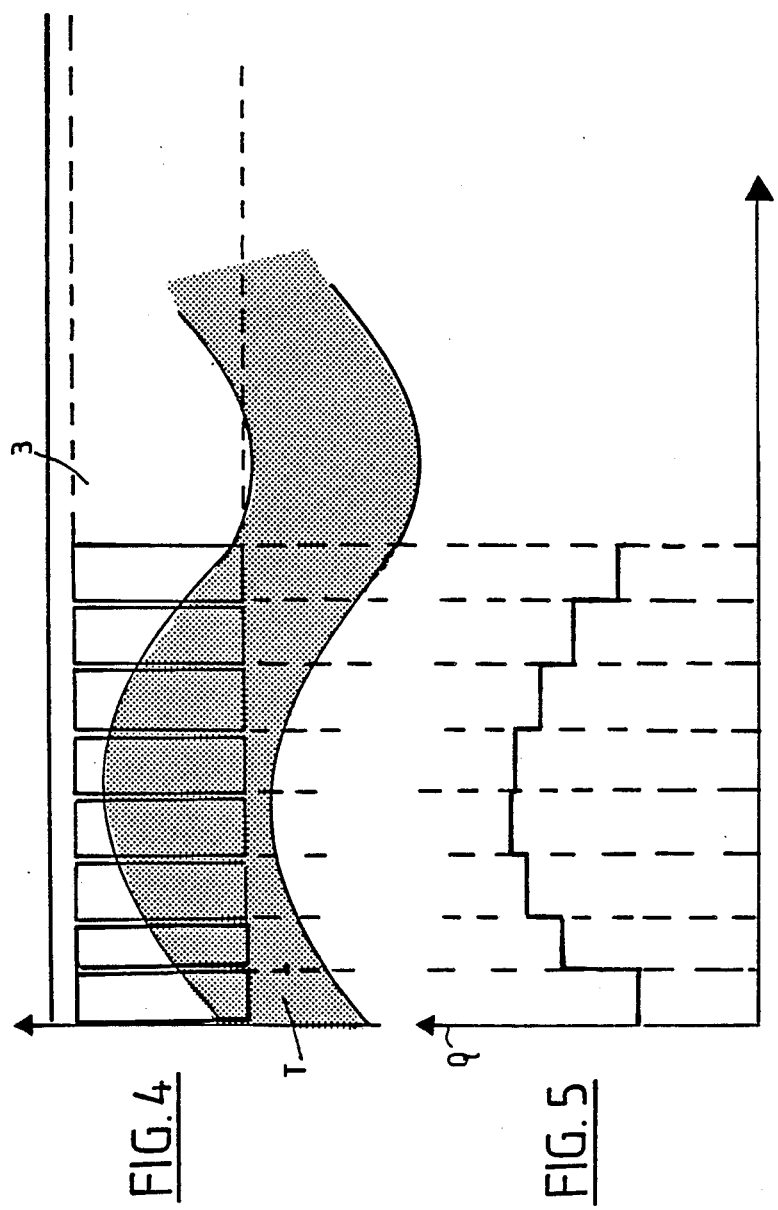

After a scan of the screen of the oscilloscope by the light spot, the distribution of the charges Q of the diodes (FIG. 5) will reflect, as shown in FIG. 4, the trace T associated with the signal in the plane of the diodes.

When several successive traces, associated with a repetitive signal, appear on the screen, the diodes acquire a charge which reflects directly the sum of the signals such as they are traced on the screen. Once integration has been made over a number of traces chosen beforehand so that saturation of the diodes is not reached, by means of a control and read-out electronics 4 coupled to the trip of the oscilloscope, the charge of the diodes is displayed on a monitoring oscilloscope 5 or stored in a digital memory 6 after analog-digital conversion.

The preceding device has been coupled to different oscilloscopes. The results are all the more spectacular the more the oscilloscope is luminous and high speed and the more the signals are highly repetitive for, with the same read-out rate of the diodes (typically 25 Hz to 1 kHz), more signals will have been accumulated.

Figure 6:
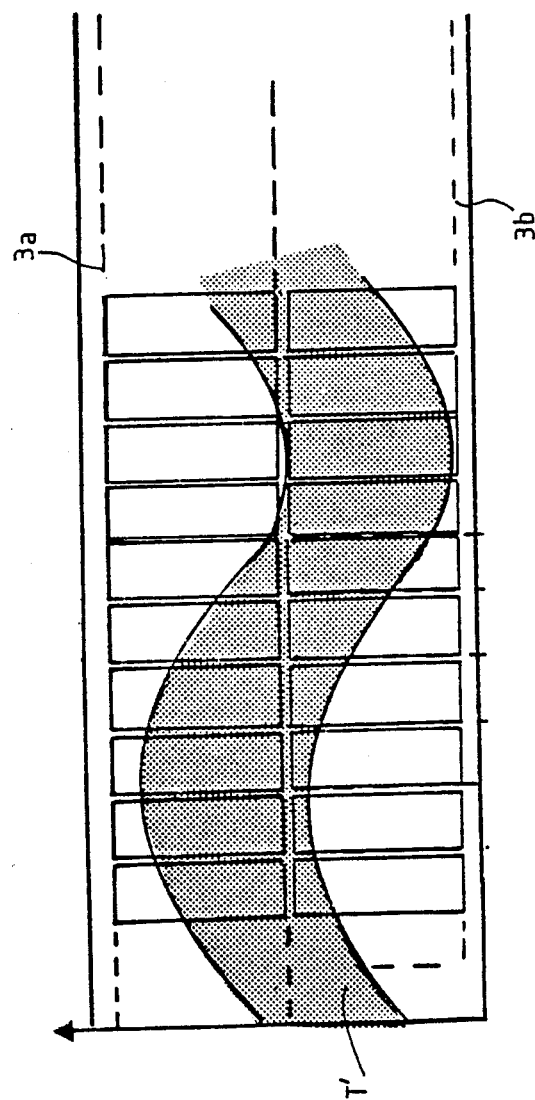
FIG. 6 illustrates the operation of a first variant of the device of FIG. 1.

In FIG. 6, the trace T' has been shown obtained by means of a differential circuit using two strips $3a$ and $3b$ or a double strip instead of strip 3 of FIG. 1. The device measures the difference of the signals from the two strips $3a$ and $3b$, which gives a good rejection of parasite light effects such as the presence of a graticule and overcomes the effects of non uniformity of the lighting in the plane of the diodes or non uniformity of the response of the diodes.

By way of variant, not illustrated, applicable when the mean is provided over a large number of passages, the trace on the screen of the oscilloscope is driven with a vertical movement, e.g. alternating or random, by superimposing an appropriate modulation signal on the signal to be analysed on the vertical deflection means. That is tantamount to replacing the instantaneous distribution of the light according to a light segment obtained in the device of FIG. 1 by means of the optical astigmatic system, by a series of light points transmitted to the strip by a conjugation optical system which may be stigmatic.

Each of these points has a mean position during N passages and the whole of these mean positions defines a discontinuous light distribution equivalent in practice to a continuous light segment.

Similarly, the astigmatism introduced by the cylindrical lens of the optical system 2, which gives an image of a point of the screen which is a vertical segment, may be obtained by acting directly on the electronic beam of the oscilloscope.

Figure 7:
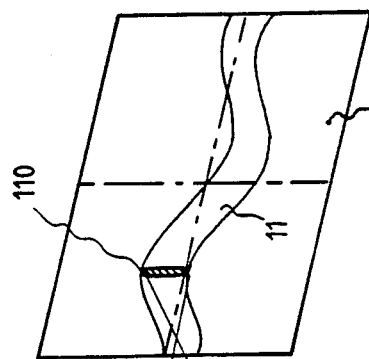
FIGS. 7 and 8 illustrate schematically a second variant in which the electronic beam of the cathode ray tube is affected with astigmatism.
Figure 7:
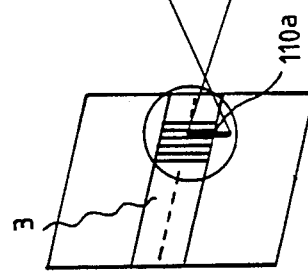
Figure 8:
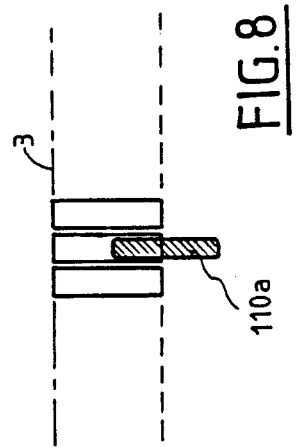

FIG. 7 illustrates such a variant. It can be seen that, on the screen 10 of the cathode ray tube, the trace 11 is formed of a light band of constant width, because the image of a point of the curve representative of the amplitude of the signal as a function of time is formed by a vertical segment 110. The conjugation optical system $2a$, although it is stigmatic, will give an image $110a$ of this segment 11 off-set in height with respect to strip 3. Each of the diodes of strip 3 will thus receive a light flux varying linearly with the mean position of the spot on the screen (FIG. 8).

In addition to its simplicity, such a device provides good rejection of the shadow effects which the graticule may introduce.

A variant of the device of FIG. 7 consists in measuring the movements of the electronic spot affected with vertical astigmatism or driven with an alternating or random movement by placing a strip of electronic detectors directly inside the cathode ray tube, without passing through the fluorescent screen and the conjugation optics.

Figure 9:
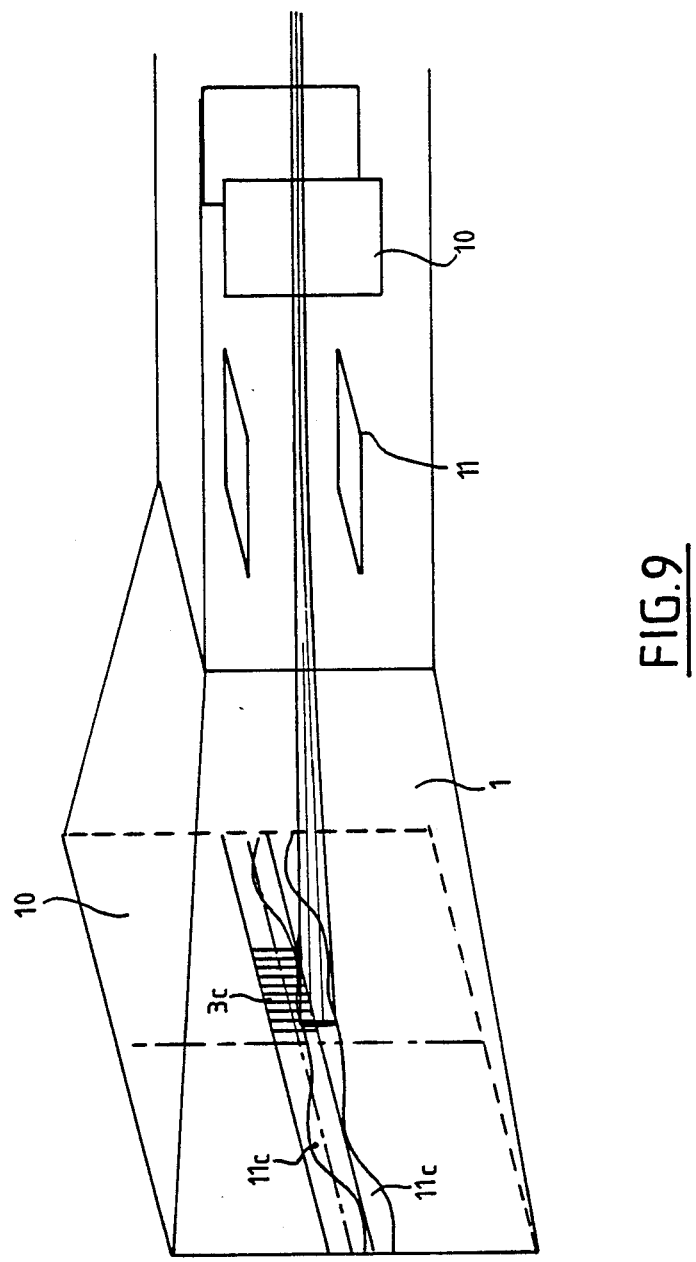
FIG. 9 shows a second embodiment in which the detector strip is placed inside the cathode ray tube.

This variant is illustrated in FIG. 9 where 10 represents the horizontal deflection member of the cathode ray tube 1, excited by a time base, not shown, and 11 the vertical deflection member adapted for producing an electronic beam affected with vertical astigmatism.

Upstream of screen 10 is interposed a strip $3c$ of electronic detectors on which the beam forms a trace $11c$ off-set with respect to the strip.

The vertical position of the spot may also be located by placing, in front of the screen or in front of the photodiodes, a transparency linearly variable in the vertical direction and integrating on the strip of diodes the whole field of the screen of the oscilloscope required for analysis of the signal with an anamorphic optical system.

This third embodiment of the invention is illustrated in FIG. 10 where an attenuator or "transparency" 7 has been shown disposed downstream of the screen 10 of the cathode ray tube and covering the whole portion of the field of the screen required for analysis of the signal. The horizontal bands shown have an attenuation inversely proportional to their mean ordinate.

The optical system $2b$ is anamorphic, i.e. it transforms each horizontal band of variable height of the attenuator into a horizontal band of more reduced constant height, so that the whole height of strips 3 is exactly covered by the image.

Thus, on the strip, a vertical detector of abscissa $x_2$ (FIG. 11) corresponds to a vertical imaginary band of given abscissa $x_1$ of the light trace and in this imaginary band the amount of light transmitted to the ordinate point $y_1$ (FIG. 12) is proportional to the ordinate $y_1$, which gives a charge of the detector element proportional to $y_1$. The curve $(y_2x_2)$ illustrates this charge.

We claim:

1. Method of recording an electric signal comprising the generation of an electronic beam providing x and y scanning representative of the amplitude variation of the signal as a function of time, characterized by recording the path of said beam on a strip of detectors each element of which, having the form of a narrow band of given abscissa and constant length, receives a flux proportional to the ordinate of the point of the path which corresponds to said abscissa.

2. Method according to claim 1, characterized in that it further comprises, for integration of the signal, the accumulation of charges generated in the strip during a pre-determined number of passages less than that which would saturate the detector elements and reading of the strip for collecting information concerning the mean ordinates.

3. Method according to claim 1, characterized in that said proportional flux is obtained by causing a portion of the corresponding detector element, of length proportional to the ordinate of said point, to correspond to each point of the path.

4. Method according to claim 3, characterized by the transformation of each point of the path into a segment of constant length, said segment being recorded on said element with an off-set such that it covers said portion.

5. Method according to claim 4, characterized in that, with said path formed by the light trace of the signal on the screen of a cathode ray tube, said narrow band is obtained by transforming, by means of an astigmatic optical system, each point of said trace into said segment of constant length.

6. Method according to claim 4, characterized by the superimposition on the signal of a modulation signal which transforms each point of said path into a succession of points whose mean positions during time cover said segment of constant length.

7. Method according to claim 1, characterized in that said flux proportional to the ordinate is obtained by attenuation of the flux corresponding to said path, with an attenuation density inversely a linear function of the ordinate of each point.

8. Method according to claim 1, characterized by the juxtapositioning of two detector strips along their large side and reading the difference of the signals accumulated in the two strips.

9. Method according to claim 1, characterized in that the strip is formed of electronic detector elements interposed in the path of the electronic beam.

* * * * *